(12) United States Patent
Mollard et al.

(10) Patent No.: US 11,835,712 B2
(45) Date of Patent: Dec. 5, 2023

(54) OPTICAL SCANNER

(71) Applicant: COMMISSARIAT A L'ENERGIE ATOMIQUE ET AUX ENERGIES ALTERNATIVES, Paris (FR)

(72) Inventors: Laurent Mollard, Grenoble (FR);
Christel Dieppedale, Grenoble (FR);
Stéphane Fanget, Grenoble (FR);
Daivid Fowler, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 323 days.

(21) Appl. No.: 17/304,873

(22) Filed: Jun. 28, 2021

(65) Prior Publication Data

US 2022/0003985 A1    Jan. 6, 2022

(30) Foreign Application Priority Data

Jul. 1, 2020 (FR) ...................... 20 06923

(51) Int. Cl.
| G02B 6/293 | (2006.01) |
| G02B 26/10 | (2006.01) |
| G02B 26/08 | (2006.01) |
| H10N 30/20 | (2023.01) |
| G02B 26/06 | (2006.01) |
| G02B 27/00 | (2006.01) |
| G02B 6/35 | (2006.01) |

(52) U.S. Cl.
CPC ......... *G02B 26/10* (2013.01); *G02B 6/29301* (2013.01); *G02B 6/29314* (2013.01); *G02B 6/3504* (2013.01); *G02B 6/3566* (2013.01); *G02B 26/06* (2013.01); *G02B 26/0858* (2013.01); *G02B 26/103* (2013.01); *G02B 27/0087* (2013.01); *H10N 30/20* (2023.02); *B81B 2201/04* (2013.01)

(58) Field of Classification Search
None
See application file for complete search history.

(56) References Cited

U.S. PATENT DOCUMENTS

2017/0299697 A1* 10/2017 Swanson ............... G01S 7/4817

FOREIGN PATENT DOCUMENTS

FR        2 923 092 A1    5/2009
WO    WO 2018/222727 A1    12/2018

OTHER PUBLICATIONS

French Preliminary Search Report dated Feb. 24, 2021 in French Application 20 06923 filed on Jul. 1, 2020, 9 pages (with English Translation of Categories of Cited Documents & Written Opinion).
Holmstrom et al., "MEMS Laser Scanners: A Review", Journal of Microelectromechanical Systems, vol. 23, No. 2, Apr. 2014, pp. 259-275.
Defay, "Integration of Ferroelectric and Piezoelectric Thin Films", Section 13.5.3, Mar. 14, 2011, 56 pages.
Sun et al., "Large-scale nanophotonic phased array", Nature, 11727, vol. 493, Jan. 10, 2013, pp. 195-199.

* cited by examiner

*Primary Examiner* — Chad H Smith
(74) *Attorney, Agent, or Firm* — Oblon, McClelland, Maier & Neustadt, L.L.P.

(57) ABSTRACT

The present invention relates to a scanner provided with a vibratory beam on or in which is formed a phased array intended to extract according to either one of two parallel faces of the beam a light radiation that could be emitted by a light source.

14 Claims, 7 Drawing Sheets

OPTICAL SCANNER

TECHNICAL FIELD

The present invention relates to the field of micro-opto-electro-mechanical systems ("MOEMS"). In particular, the present invention relates to an optical scanner allowing scanning the surrounding space by light extraction at two parallel faces of a beam.

In this respect, the scanner according to the present invention combines a beam provided with a movable portion on which a bending or a torsion could be imparted, and a phased array.

In particular, the arrangement of the phased array in the movable portion of the beam allows extracting, according to either one of two parallel faces of the beam, a light radiation that could be emitted by a light source.

PRIOR ART 2D scanners or micro-scanners are devices allowing scanning with a light beam a scene according to one, and possibly two, dimension(s). In particular, these scanners may be implemented in LIDAR ("Light Detection And Ranging systems") type devices for detection or imaging purposes.

In practice, scanning of a surface or of an object by a light beam may be carried out by means of one or several movable micro-mirror(s).

In this respect, FIG. 1 (extracted from the document [1] mentioned at the end of the description) illustrates a first possible architecture of such a device provided with two micro-mirrors, respectively called first micro-mirror $1_1$ and second micro-mirror $2_1$, arranged so as to pivot, respectively, about non-parallel first pivot axis $X_1X_1'$ and second pivot axis $Y_1Y_1'$. In particular, these two micro-mirrors $1_1$ and $2_1$ are arranged so that a light beam emitted by a light source $3_1$ is reflected by the first micro-mirror $1_1$ in the direction of the second micro-mirror $2_1$ which, in turn, reflects it, for example, in the direction of a screen $4_1$. Thus, the rotation of each of the micro-mirrors $1_1$ and $2_1$ about their respective pivot axis allows performing a scanning of a surface with the light beam, for example, for imaging or detection purposes.

However, such an architecture is not satisfactory.

Indeed, the latter remains merely compact because of the presence of two micro-mirrors.

Moreover, this architecture requires an accurate alignment of the two micro-mirrors, and is, consequently difficult to make.

Finally, the micro-mirrors could also suffer from a damage, in particular by a heat-up induced by the light beam.

In order to overcome these problems, a second architecture, illustrated in FIG. 2 (extracted from the document [1] mentioned at the end of the description), may be considered. The latter implements one single micro-mirror $1_2$ pivotally mounted about two non-parallel pivot axes $X_2X_2'$ and $Y_2Y_2'$. Thus, the oscillation of this micro-mirror $1_2$ about either one of the two pivot axes $X_2X_2'$ and $Y_2Y_2'$ allows scanning the surface of a screen $4_1$ by means of a light beam originating from a light source $3_2$ and reflected by said micro-mirror $1_2$.

Nonetheless, this second architecture is not satisfactory either.

Indeed, like the first architecture, the micro-mirror $1_2$ could also suffer from a heat-up induced by the light beam.

Moreover, this second architecture is also sensitive to the alignment of the light source $3_2$ and of the micro-mirror $1_2$. In particular, the alignment between these two elements is sensitive to the impacts undergone by the device but also to the temperature and pressure conditions imposed on the latter.

Furthermore, the oscillations of the micro-mirror about either one of the two pivot axes $X_2X_2'$ and $Y_2Y_2'$, induced by an actuator, are never decoupled so that mechanical crosstalks are likely to occur.

Alternatively to the architectures disclosed hereinbefore, 2D micro-scanners with an optical phased emitter or Optical Phased Array ("OPA") have also been proposed.

These may comprise a plurality of optical sources each being able to emit a light radiation. Moreover, each of its optical sources is associated to phase modulation means intended to phase-shift the optical radiations with respect to one another so as to make the angle of propagation of the combined radiation derived from all light sources vary. According to an advantageous configuration, the optical sources may be derived from the same main source.

This operating principle may be extrapolated to a 2D matrix of optical sources enabling a scanning by means of an optical beam according to two different directions, for example perpendicular to one another.

Nonetheless, these devices are not satisfactory either.

Indeed, the space that is actually scanned by the light beam remains relatively limited.

Consequently, an object of the present invention is to provide a light scanning device that allows scanning a space larger than the known devices of the prior art.

Another object of the present invention is to provide a light scanning device that is compact.

DISCLOSURE OF THE INVENTION

The objects of the invention are achieved, at least partially, by an optical scanner which comprises:
  a fixed planar support;
  a beam, provided with a first face and with a second face, held secured by one of its ends, called fixed end, to the planar support and perpendicular to a main face of said support;
  an actuator arranged to impart either a bending or a torsion on a movable portion of the beam extending from a free end of said beam and opposite to the fixed end;
  an optical source adapted to emit a main optical beam with a wavelength $\lambda$;
  a plurality of waveguides disposed on or in the beam and intended to split the main optical beam into a plurality of secondary optical beams;
  an optical phased array which comprises a plurality of optical phase-shifters each coupled to a waveguide, disposed on or in an emission section of the movable portion and which extends from the free end, the emission section having a transparency adapted to enable light extraction from the first face and from the second face.

The combined implementation of a movement of the beam and of an optical phased array allowing emitting a light radiation on either side of said beam allows extending the surfaces or areas that are actually scanned.

Moreover, this device which requires only a slight alignment of the incident beam, or not at all, is simpler to implement than the known systems of the prior art.

Furthermore, this combination of a beam provided with a movable portion and of an optical phased array confers a substantial compactness thereon in comparison with the known devices of the prior art.

According to one implementation, the beam comprises from its first face towards its second face a first layer, a second layer and a third layer optically transparent to a light beam having a wavelength λ, the waveguides and the optical phase-shifters being disposed in the first layer.

According to one implementation, the emission section comprises only the first layer.

According to one implementation, the first layer comprises a dielectric material, advantageously the third layer also comprises a dielectric material.

According to one implementation, each optical phase-shifter comprises a diffraction grating coupled to phased-shifting means intended to impart a phase-shift on the secondary optical beam originating from the waveguide to which the considered optical phase-shifter is optically coupled.

According to one implementation, each diffraction grating is arranged so that the light extraction is equal at the first face and the second face.

According to one implementation, each diffraction grating is arranged so that the light extraction at the first face is higher than the one observed at the second face.

According to one implementation, the first layer and the third layer comprise silicon dioxide, and the second layer comprises silicon.

According to one implementation, the plurality of waveguides and/or the diffraction gratings comprise silicon nitride.

According to one implementation, the optical phase-shifters are arranged in rows parallel or perpendicular to the axis of elongation.

According to one implementation, the optical phase-shifters are arranged in a matrix-like manner.

According to one implementation, the actuator is arranged so that the bending that could be imparted on the movable portion by said actuator is performed according to a plane perpendicular to the first and second faces.

According to one implementation, the actuator comprises at least one of the means selected amongst: electrostatic means, magnetic means, piezoelectric means, thermal means.

According to one implementation, the actuator is arranged so that the torsion that could be imparted on the movable portion by said actuator is performed about an axis of elongation defined by the fixed end and the free end.

BRIEF DESCRIPTION OF THE DRAWINGS

Other features and advantages will become apparent in the following description of an optical scanner according to the invention, provided as non-limiting examples, with reference to the appended drawings wherein.

DETAILED DISCLOSURE OF PARTICULAR EMBODIMENTS

The present invention relates to a scanner provided with a vibratory beam on or in which is formed a phased array intended to extract according to either one of two parallel faces of the beam a light radiation that could be emitted by a light source.

Figure 1:
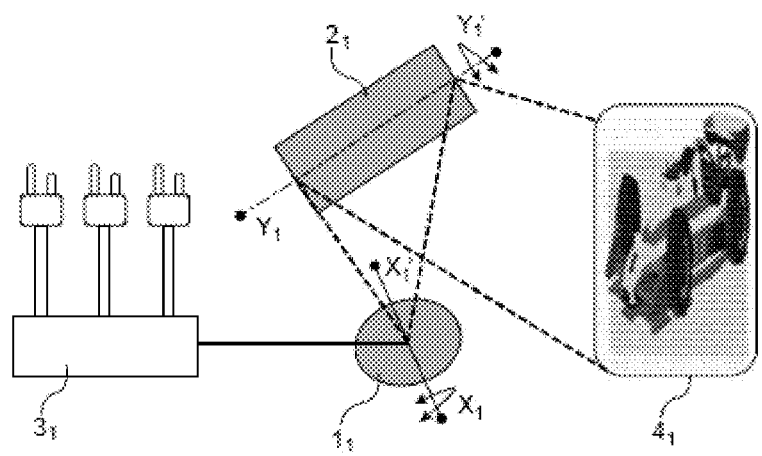
FIG. 1 illustrates a first architecture of a known light scanning device from the prior art, and in particular from the document [1] mentioned at the end of the description, the device also comprises two micro-mirrors each pivotally mounted about a different pivot axis and non-parallel.
Figure 2:
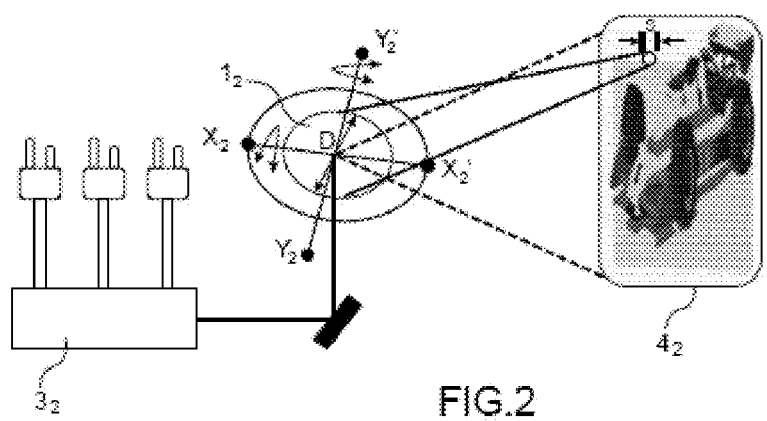
FIG. 2 illustrates a second architecture of a known light scanning device from the prior art, and in particular from the document [1] mentioned at the end of the description, the device also comprises a micro-mirror pivotally mounted about two different and non-parallel pivot axes.
Figure 3:
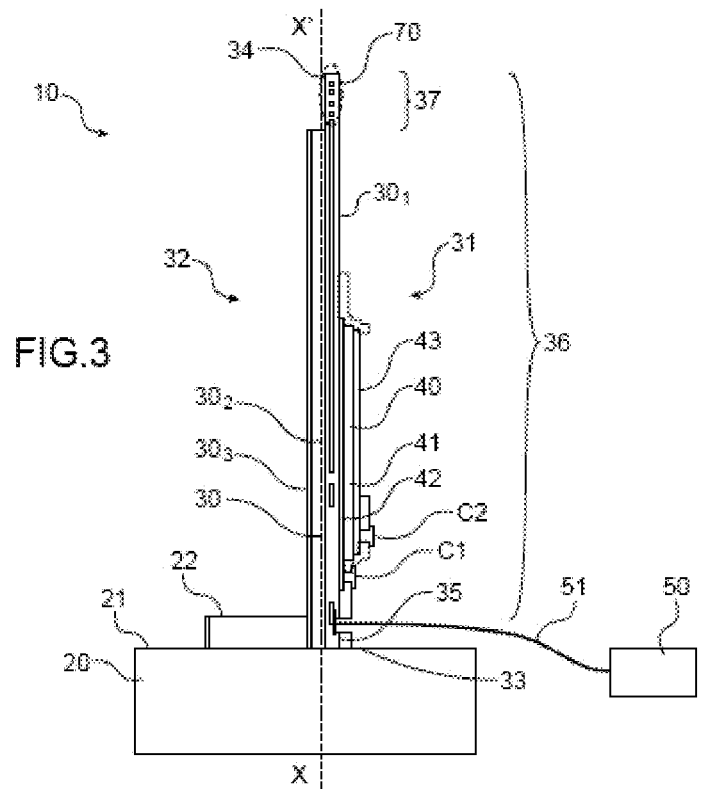
FIG. 3 is a schematic representation of an optical scanner according to a sectional plane perpendicular to the first face and comprising the axis of elongation XX' according to a first example of the present invention.

Thus, FIG. 3 is a schematic representation of a first example of implementation of a scanner 10 according to the present invention.

In particular, the scanner 10 comprises a fixed planar support 20 provided with a main face 21. In particular, the planar support 20 may be obtained from a semiconductor substrate, for example silicon.

However, the invention is not limited only to this implementation, and said planar support 20 may comprise any other material that could ensure the support function.

The scanner 10 also comprises a beam 30 provided with a first face 31 and with a second face 32, and which extends, according to an axis of elongation from a fixed end 33 towards a free end 34.

By "beam", it should be understood a generally elongate-shaped solid mechanical element. As an example, a beam according to the terms of the present invention may have a parallelepipedic shape.

Moreover, the beam 30 comprises a movable portion 36 which extends from the free end 34 towards the fixed end 33.

By "movable portion", it should be understood a beam portion that could undergo a deformation by bending and/or by torsion. For example, the movable portion may undergo a bending according to a direction perpendicular to the first face and/or a torsion about an axis of elongation XX' defined by the fixed end and the free end.

According to the present invention, the beam 30 is fastened perpendicularly to the main face 21. A wedge 22 may be implemented in order to ensure holding of the beam 30 perpendicularly to the main face 21. More particularly, to ensure such holding, the wedge 22 may be in contact with a portion of the beam 30, called fixed portion 35, which extends from the fixed end 33 and is adjacent to the movable portion 36.

The scanner 10 also comprises an actuator 40 configured to impart either a bending or a torsion of the movable portion.

The actuator 40 may be controlled by control means, for example electronic control means, in particular equipped with a microprocessor or with a calculator. In particular, these control means may be adapted to make the beam vibrate in bending and/or in torsion. In particular, these control means may impart a vibration on the beam in bending and/or in torsion. In particular, this vibration may have a frequency equal to the resonance frequency of the beam.

A "bending" of the beam corresponds to a deformation of the latter according to a plane perpendicular to the first face 31, whereas a torsion corresponds to a deformation about the axis of elongation XX'.

For example, the actuator 40 may comprise means selected amongst: electrostatic means, magnetic means, piezoelectric means, thermal means. Nonetheless, the invention is not limited only to these means.

The actuator 40 may be disposed at least partially on the movable portion 36. More particularly, the actuator 40 may partially cover the movable portion 36 and the fixed portion 35 at the first face.

The example represented in FIG. 3 implements a piezoelectric actuator 40. In particular, in this example, the actuator 40 comprises a piezoelectric material layer 41 interposed between two electrodes 42 and 43 intended to impose a non-zero electric voltage on either side of said piezoelectric material layer 41. In this respect, the actuator 40 may be provided with contacts C1 and C2 at which a power supply voltage of the electrodes may be applied. In particular, this power supply voltage may be applied with the control means. By the action of this electric voltage (electric polarization field), the piezoelectric material layer contracts according to a plane perpendicular to the first face 31, and causes bending of the movable portion 36 of the beam 30. In this respect, and as set out in the document [2] mentioned at the end of the description, the higher the electric polarization field imposed to the piezoelectric material layer (for example a PZT layer), the greater will be the bending of the set formed by said layer and the beam. This bending depends not only on the mechanical and geometric properties of the beam but also on the electric polarization field imposed to the piezoelectric material layer.

The bending direction of the piezoelectric material layer may depend on the sign of the electric voltage imposed by the electrodes, in particular when said layer comprises a non-ferroelectric piezoelectric material.

In turn, the bending magnitude may depend on numerous parameters among which mention may be made of: the stiffness of the beam, the magnitude of the voltage imposed by the electrodes, the thickness of the piezoelectric material layer.

More particularly, for a given load, the bending magnitude of a beam is directly proportional to the fourth power of its length and inversely proportional to the product of its thickness by its moment of inertia.

In other words, the bending magnitude of a beam increases with its length and/or when its thickness decreases.

Thus, and considering the foregoing, the bending magnitude depends on the mechanical and geometric parameters of the beam, but is also a function of the polarization field imposed by the electrodes.

The beam may also feature an initial bending which has an influence on the bending magnitude of the latter.

Advantageously, it is possible to make the beam vibrate, and more particularly at its resonance frequency in order to confer on the scanner a better quality factor, and thus benefit from the mechanical quality factor. An operation at the resonance frequency also allows amplifying the movement of the beam.

In this respect, the resonance frequency of a beam with a length L, a width b, a thickness h and a density p and a Young's modulus E complies with the following relationship:

$$\left(\frac{E}{\rho}\right)^{1/2} \frac{h}{L^2}$$

Thus, the resonance frequency increases with the thickness and decreases when its length increases. Nevertheless, this decrease with the thickness follows a square law and is therefore more pronounced when it is actually the length that is modified.

In other words, the resonance frequency of the beam may be adjusted by its thickness and its length.

The piezoelectric material layer may comprise at least one of the materials selected amongst: PZT (lead zirconate titanate) or AlN (aluminum nitride). Other piezoelectric materials may be considered.

The beam 30 may have a thickness comprised between 1 μm and a few hundreds of micrometers, a length comprised between 100 μm and several millimeters, and a width comprised between 10 μm and several millimeters.

The thickness of the beam is defined as the distance separating the first face and the second face. In turn, the length of the beam is its dimension measured according to the direction defined by the axis of elongation XX' whereas its width is its dimension measured according to a direction perpendicular to the one defined by the axis of elongation XX' and the thickness of said beam.

Advantageously, the beam 30 may comprise from its first face towards its second face, a first layer $30_1$, a second layer $30_2$ and a third layer $30_3$.

It will become more apparent in the following disclosure that the first layer $30_1$, and the third layer $30_3$ may advantageously comprise a dielectric material.

The optical scanner 10 also comprises an optical source 50, intended to emit a light beam on or in the beam 30 and more particularly on or in the first layer $30_1$.

In this respect, the optical source 50 is intended to emit a main optical beam having a wavelength λ. Advantageously, the main optical beam is almost monochromatic, and possibly monochromatic. For example, the optical source 50 may comprise a LASER source.

The wavelength λ may be comprised between 400 nm and 2500 nm, for example equal to 905 nm, or equal to 1330 nm or still equal to 1550 nm.

Advantageously, the main optical beam emitted by the optical source 50 is transmitted at the beam 30 by optical coupling means 51, for example by an optical fiber.

Figure 4:
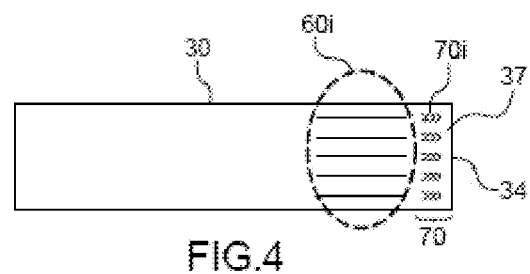
FIG. 4 is a partial representation of an optical scanner according to a view directly opposite the first face and illustrating an arrangement of the waveguides that could be implemented in the context of the present invention.

The optical scanner 10 also comprises a plurality of waveguides 60i disposed on or in the beam 30 and intended to split the main optical beam into a plurality of secondary optical beams. In this respect, FIG. 4 illustrates a possible arrangement of the waveguides 60i according to a view directly opposite the first face 31. According to this example, these waveguides are disposed parallel to the axis of elongation XX', and so that the ratio between their spacing (in µm) and the wavelength λ (in nm) is comprised between 0.5 and 10.

For example, the waveguides may have a length comprised between one hundred microns and ten millimeters, and be spaced apart from one another by a distance comprised between one hundred microns and ten millimeters.

The example illustrated in FIG. 4 is not supposed to limit the present invention only to this arrangement, and it will become more apparent in the following disclosure that other arrangements and/or geometries could be considered.

The optical scanner 10 also comprises an optical phased array 70.

The phased array 70 may be piloted by the control means.

In particular, the optical phased array 70 comprises a plurality of optical phase-shifters 71i each coupled to a waveguide 60i.

Moreover, the optical phase-shifters 71i are disposed on or in an emission section 37 of the movable portion 36 and which extends from the free end 34.

In particular, the emission section 37 features a transparency adapted to enable a light extraction from the first face and from the second face. In other words, the main optical beam may be extracted in the form of a first beam at the first face and of a second beam at the second face.

According to the present invention, each optical phase-shifter 70i may comprise a diffraction grating 71i coupled to phase-shifting means 72i.

In particular, each phase-shifting means 72i is intended to impart a phase-shift on the secondary optical beam originating from the waveguide 60i to which the considered optical phase-shifter 70i is optically coupled. Phase-shifts that are different from one phase-shifting means to another may be implemented. Several ways for modifying the effective index of a waveguide and therefore the output phase by a determined wavelength of an electrically-controlled guide may be provided. The variation of the index of the material of the guide may be achieved by thermo-optic effect, or by electro-optic effect.

Figure 5:
FIG. 5 is an illustration of an optical phase-shifter according to a first architecture that could be implemented in the context of the present invention.

FIG. 5 is an illustration of an optical phase-shifter 70i according to a first architecture that could be implemented in the context of this first example. In particular, the diffraction grating 71i is formed by pads aligned in the continuation of the waveguide 60i, whereas the phase-shifting means 72i may comprise a heating element disposed directly opposite the waveguide 60i and intended to locally heat the latter in order to modulate its refractive index.

Figure 6:
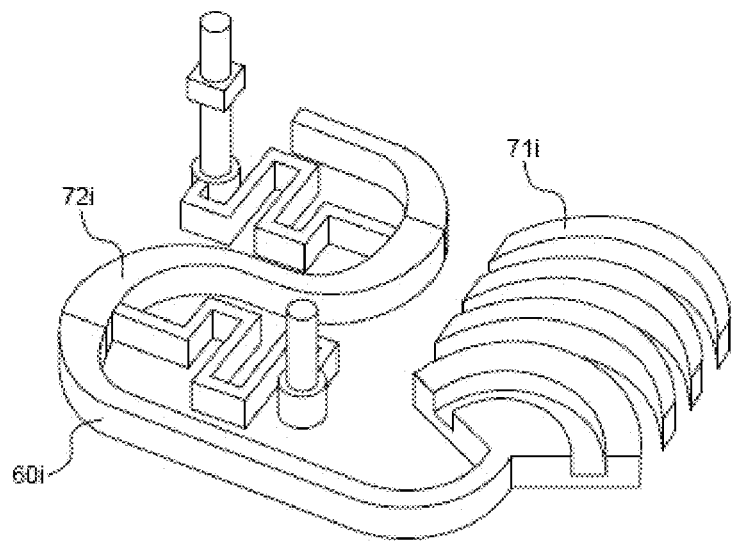
FIG. 6 is an illustration of an optical phase-shifter (derived from the document [3] mentioned at the end of the description) according to a second architecture that could be implemented in the context of the present invention.

FIG. 6 is an illustration of an optical phase-shifter 70i according to a second architecture that could be implemented in the context of this first example. In particular, the diffraction grating 71i is formed by aligned solid arcs, whereas the phase-shifting means 72i may comprise a heating element intended to locally heat the waveguide 60i in order to modulate its refractive index.

Still according to this first example, the optical phase-shifters may be arranged in line perpendicularly to an axis of elongation XX' defined by the fixed end and the free end (FIG. 4).

The optical scanner according to this first example allows scanning the space on either side of the beam 30 according to a first scan direction. In particular, the application of an electric voltage at the electrodes 42 and 43 allows imparting a bending on the beam. This bending enables each of the first beam and the second beam to scan a half-space called, respectively, first half-space E1 and second half-space E2, according to a first angle range θ defined by the magnitude of bending of the beam. The angle θ may then amount to a few degrees, preferably a few tens degrees.

The implementation of the optical phased array 70 allows imparting on the first beam and on the second beam a second scan direction perpendicular to the first scan direction, and according to a second angle range φ.

Figure 7:
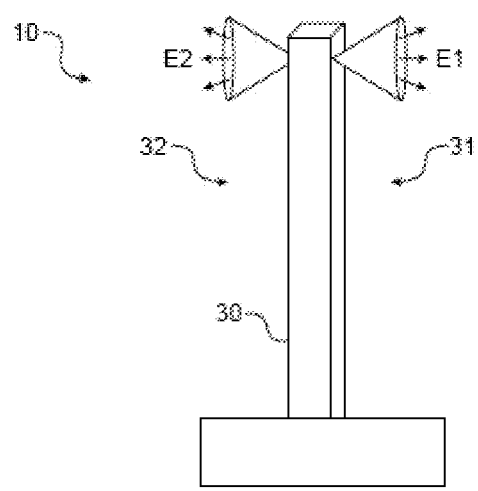
FIG. 7 is a schematic representation of the optical scanner made according to the first example and in operation.

In the first example, the first scan direction obtained thanks to the movement of the movable portion of the beam 30 is perpendicular to the second scan direction obtained thanks to the phase-shift of the optical wave emitted by the optical phased array 70. Thus, the first beam and the second beam could scan, respectively, in the first half-space and the second half-space a surface whose limits are defined by the maximum values of the angles θ and φ (FIG. 7).

According to a first variant of this first example, the waveguides and the optical phase-shifters are disposed in the first layer $30_1$. In other words, the first layer $30_1$ forms a sheath around the waveguides.

Moreover, still according to this first variant, the emission section 37 comprises only the first layer $30_1$ (FIG. 3). Thus, the second beam that could be extracted at the second face 32 is no longer screened/absorbed by the second layer $30_2$ and the third layer $30_3$. This arrangement allows implementing a second layer made of silicon and considering a main optical beam with a wavelength λ equal to 905 nm.

According to a second variant of this first example, which may replicate the features related to the first variant, each diffraction grating 70i may be arranged so that the light extraction is equal at the first face 31 and the second face 32.

According to this second variant, each diffraction grating may be symmetrical with respect to a midplane of the first layer $30_1$. In this respect, each diffraction grating may replicate the architectures represented in FIGS. 5 and 6.

According to a third variant of this first example, which may replicate the features related to the first variant, each diffraction grating is arranged so that the light extraction at the first face is greater than the one observed at the second face.

For example, each diffraction grating 70i may be asymmetrical with respect to a midplane of the first layer $30_1$. In this respect, each diffraction grating 71i may be formed on a base. More particularly, the diffraction grating 71i may comprise pads that are evenly disposed on a waveguide.

Figure 8:
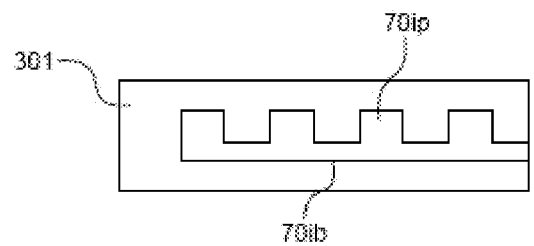
FIG. 8 is a detail view of a diffraction grating wrapped by the first layer, and which comprises a base waveguide and evenly spaced pads.

In this respect, FIG. 8 is a detail view of such a diffraction grating 71i wrapped by the first layer $30_1$, and which comprises the waveguide 71ib and the evenly spaced pads 71ip. However, the invention is not limited only to this architecture implementing pads. More particularly, solid arcs such as those described in connection with FIG. 6 may also be considered.

Regardless of the considered variant, the plurality of waveguides and/or the diffraction gratings may comprise silicon nitride.

Figure 9:
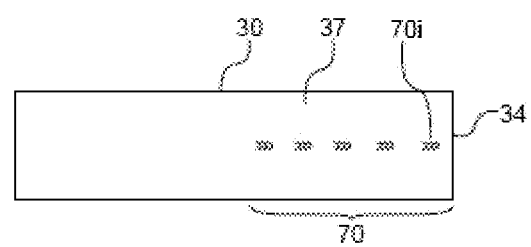
FIG. 9 is a partial representation of an optical scanner according to a view directly opposite the first face and illustrating an arrangement of the diffraction gratings according to a second example of the present invention.

The invention also relates to a second example which differs from the first example in that the optical phase-shifters are arranged in rows parallel to the axis of elongation XX' (FIG. 9).

The optical scanner according to this second example allows scanning the space on either side of the beam 30 according to a first scan direction. In particular, the application of an electric voltage at the electrodes 42 and 43 allows imparting a bending on the beam. This bending enables each of the first beam and the second beam to scan a half-space called, respectively, first half-space E1 and second half-space E2, according to a first angle range θ defined by the magnitude of bending of the beam. The angle θ may then amount to a few degrees, preferably a few tens degrees.

The implementation of the optical phased array 70 allows imparting on the first beam and on the second beam, still according to the first scan direction and according to a second angle range φ.

According to this second example, the two scan ranges add up so that the scan angle of the first beam and of the second beam could vary between θ+φ and θ−φ.

Figure 10:
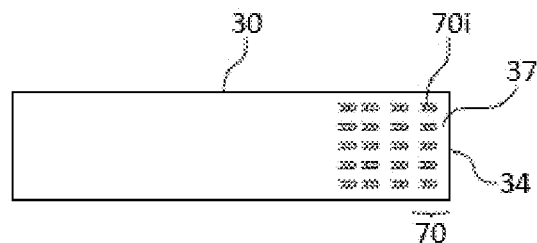
FIG. 10 is a partial representation of an optical scanner according to a view directly opposite the first face and illustrating an arrangement of the diffraction gratings according to a third example of the present invention.

The invention relates to a third example which essentially replicates all of the features of the first example. Nonetheless, in this third example, the optical phase-shifters 70i are arranged in a matrix-like manner (FIG. 10). By "arranged in a matrix-like manner", it should be understood arranged according to N rows and M columns.

According to this third example, it is possible to scan the first half-space and the second half-space according to two scan directions without necessarily implementing the actuator 40.

The three examples of implementation have been presented in the context of a bending of the beam. Nonetheless, it is possible to impart a torsional deformation of the beam 30 about the axis of elongation XX'.

Figure 11:
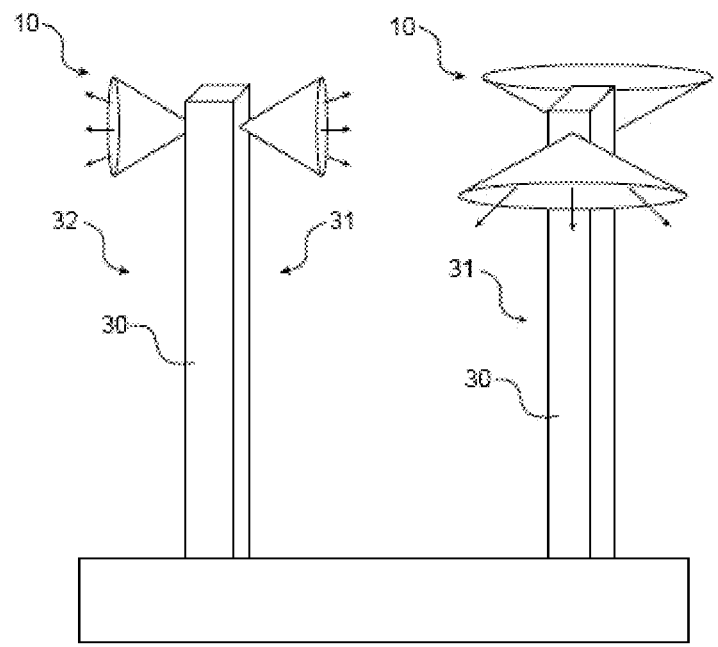
FIG. 11 is a representation implementing two optical scanners according to the present invention.

Moreover, regardless of the considered example, it is possible to associate at least two optical scanners each having a different orientation. For example, two optical scanners may be positioned proximate to one another and so that the first faces 31 of each of the two beams 30 are perpendicular (FIG. 11).

The invention also relates to a method for manufacturing the optical scanner 10.

In particular, this method comprises a step that consists in providing a substrate made of a semiconductor material, for example silicon.

An oxide layer 110, for example silicon oxide, with a 1 μm thickness may be formed over a front face 101 of said substrate 100. In particular, this oxide layer may be formed by thermal oxidation.

Figure 12:
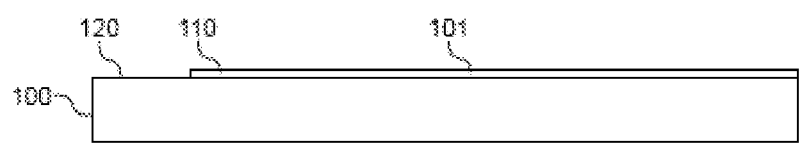
FIGS. 12, 13, 14 and 15 are schematic representations of steps of a method for manufacturing the optical scanner according to the present invention.

Moreover, a partial removal of the oxide layer 110 in an area 120 delimiting the emission section is performed. This partial removal may involve a photolithography sequence and an etching (FIG. 12).

The method also comprises a step of forming a polysilicon layer 130, for example with a 9 μm thickness, covering the area 120 and the oxide layer 110.

Figure 13:
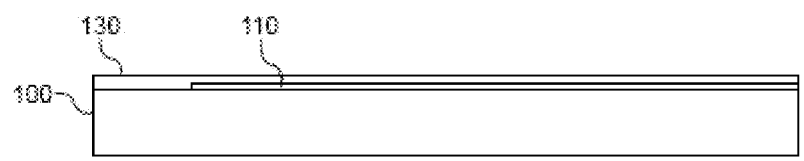
Figure 14:
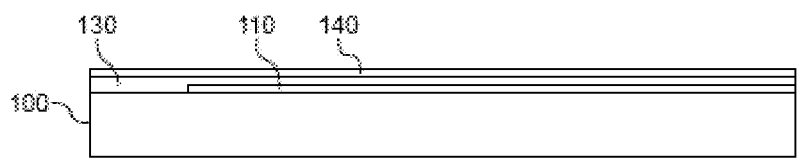
Figure 15:
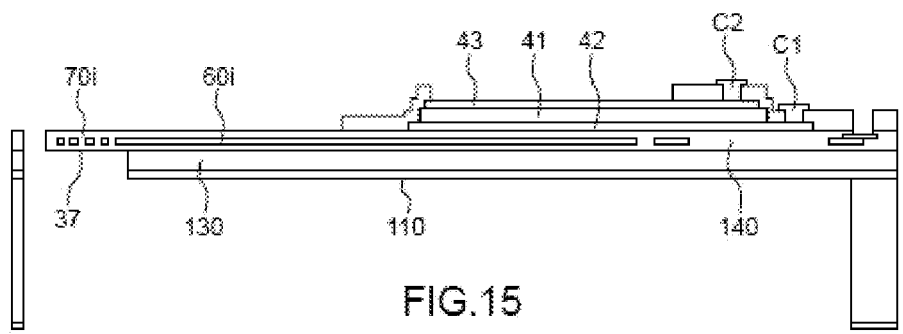

This step may be followed by a step of planarizing the poly-silicon layer 120, for example a chemical-mechanical polishing step (FIG. 13).

Afterwards, a second oxide layer 140 is formed covering the poly-silicon layer 130.

The second oxide layer 140 is then covered with a silicon nitride layer at which the waveguides 60i and the diffraction gratings 71i are formed by an etching step. Afterwards, these may be encapsulated with a third oxide layer 150 which forms, together with the second oxide layer, the previously-described first layer $30_1$.

This sequence is then followed by the formation of the electrode 42, of the piezoelectric material layer 41 (in particular PZT) and by the formation of the electrode 43. A PZT layer, as well as the electrodes may be formed according to different methods which may comprise in particular a transfer, a deposition. Contact points C1 and C2 intended to electrically contact, respectively, the electrode 42 and the electrode 43 are also formed.

Afterwards, it is proceeded with a relaxation of the beam 30 formed by the layers 110, 130, 140 and 150 by etching the substrate 100 from a rear face opposite to the front face 101.

This etching is also followed by a removal of the layers 110 and 130 at the emissive section 37.

This method is provided only as an example, and is not intended to limit the present invention to an optical scanner obtained only by this method.

The scanner 10 according to the present invention may advantageously be implemented in an image projector with a reduced size (for example a pico-projector) in mobile electronic equipment and, more particularly, a mobile phone, a smartwatch, in intra-retinal projection equipment (for augmented reality).

The scanner may also be implemented in the context of a 3D application, and in particular 3D imaging.

The scanner 10 may also form the active portion of a LIDAR, and for example be implemented in an autonomous vehicle.

REFERENCES

[1] Sven Holmstrom et al., "MEMS laser scanners: a review", Journal of Microelectromechanical Systems. April 2014, DOI: 10.1109/JMEMS.2013.2295470;
[2] Section 13.5.3 of the book "Integration of Ferroelectric and Piezoelectric Thin Films" of Defay;
[3] Jie Sun et al., "Large-scale nanophotonic phased array", Nature, 11727, vol 493, 195-199, January 2013.

The invention claimed is:

1. An optical scanner which comprises:
   a fixed planar support;
   a beam, provided with a first face and with a second face, held secured by one of its ends, called a fixed end, to the planar support and perpendicular to a main face of said support;
   an actuator arranged to impart either a bending or a torsion on a movable portion of the beam extending from a free end of said beam and opposite to the fixed end;
   an optical source adapted to emit a main optical beam with a wavelength λ;
   a plurality of waveguides disposed on or in the beam and intended to split the main optical beam into a plurality of secondary optical beams;
   an optical phased array which comprises a plurality of optical phase-shifters each coupled to a waveguide, disposed on or in an emission section of the movable portion and which extends from the free end, the emission section having a transparency adapted to enable light extraction from the first face and from the second face.

2. The optical scanner according to claim 1, wherein the beam comprises from its first face towards its second face a first layer, a second layer and a third layer optically transparent to a light beam having a wavelength λ, the waveguides and the optical phase-shifters being disposed in the first layer.

3. The optical scanner according to claim 2, wherein the emission section comprises only the first layer.

4. The optical scanner according to claim 2, wherein the first layer comprises a dielectric material, advantageously the third layer also comprises a dielectric material.

5. The optical scanner according to claim 2, wherein each optical phase-shifter comprises a diffraction grating coupled to phased-shifting means intended to impart a phase-shift on the secondary optical beam originating from the waveguide to which the considered optical phase-shifter is optically coupled.

6. The optical scanner according to claim 5, wherein each diffraction grating is arranged so that the light extraction is equal at the first face and the second face.

7. The optical scanner according to claim 5, wherein each diffraction grating is arranged so that the light extraction at the first face is higher than the one observed at the second face.

8. The optical scanner according to claim 2, wherein the first layer and the third layer comprise silicon dioxide, and the second layer comprises silicon.

9. The optical scanner according to claim 2, wherein the plurality of waveguides and/or diffraction gratings comprise silicon nitride.

10. The optical scanner according to claim 1, wherein the optical phase-shifters are arranged in rows parallel or perpendicular to an axis of elongation XX' defined by the fixed end and the free end.

11. The optical scanner according to claim 1, wherein the optical phase-shifters are arranged in a matrix-like manner.

12. The optical scanner according to claim 1, wherein the actuator is arranged so that the bending that could be imparted on the movable portion by said actuator is performed according to a plane perpendicular to the first and second faces.

13. The optical scanner according to claim 12, wherein the actuator comprises at least one of the means selected amongst: electrostatic means, magnetic means, piezoelectric means, thermal means.

14. The optical scanner according to claim 1, wherein the actuator is arranged so that the torsion that could be imparted on the movable portion by said actuator is performed about an axis of elongation defined by the fixed end and the free end.

* * * * *